United States Patent
Kashkoush et al.

(10) Patent No.: US 6,626,189 B2
(45) Date of Patent: Sep. 30, 2003

(54) METHOD OF PROCESSING SUBSTRATES USING PRESSURIZED MIST GENERATION

(75) Inventors: Ismail Kashkoush, Orefield, PA (US); Richard Novak, Plymouth, MN (US); Dennis Nemeth, Nazareth, PA (US); Gim-Syang Chen, Allentown, PA (US)

(73) Assignee: Akrion, LLC, Allentown, PA (US)

( * ) Notice: Subject to any disclaimer, the term of this patent is extended or adjusted under 35 U.S.C. 154(b) by 0 days.

(21) Appl. No.: 10/304,583

(22) Filed: Nov. 25, 2002

(65) Prior Publication Data

US 2003/0111092 A1 Jun. 19, 2003

Related U.S. Application Data

(62) Division of application No. 10/117,768, filed on Apr. 5, 2002, now Pat. No. 6,532,974.
(60) Provisional application No. 60/282,351, filed on Apr. 6, 2001.

(51) Int. Cl.⁷ ............................. B08B 3/00; B08B 3/12
(52) U.S. Cl. .............................. 134/1.3; 134/2; 134/18; 134/26; 134/30; 134/902
(58) Field of Search ............................ 134/1.3, 1, 2, 18, 134/26, 30, 56 R, 100.1, 113, 184, 186, 200, 902

(56) References Cited

U.S. PATENT DOCUMENTS

| | | | |
|---|---|---|---|
| 5,464,480 A | 11/1995 | Matthews | |
| 5,653,045 A | 8/1997 | Ferrell | |
| 6,136,724 A | 10/2000 | Hansen | |
| 6,272,768 B1 | 8/2001 | Danese | |
| 6,273,108 B1 | 8/2001 | Bergman | |
| 6,357,142 B1 | 3/2002 | Bergman | |
| 6,387,822 B1 * | 5/2002 | Murphy et al. | 438/745 |
| 6,399,513 B1 * | 6/2002 | Murphy et al. | 438/725 |
| 2002/0033186 A1 | 3/2002 | Verhaverbeke | |
| 2002/0066717 A1 | 6/2002 | Verhaverbeke | |

* cited by examiner

Primary Examiner—Zeinab El-Arini
(74) Attorney, Agent, or Firm—Cozen O'Connor; Michael B. Fein; Brian L. Belles

(57) ABSTRACT

A method for stripping photoresist from semiconductor wafers. In one aspect, the invention is a method for processing integrated circuits comprising: placing at least one wafer having an edge in a process tank having a lid; closing the lid; filling the process tank with a process liquid to a predetermined level below the edge of the wafer; supplying a process gas under pressure to a remaining volume of the process tank; and applying acoustical energy to the process liquid so as to form a mist of process liquid in the process tank. Preferably, the process liquid is ozonated deionized water and the process gas is ozone.

14 Claims, 3 Drawing Sheets

METHOD OF PROCESSING SUBSTRATES USING PRESSURIZED MIST GENERATION

CROSS-REFERENCE TO RELATED APPLICATION

This application is a divisional application of Ser. No. 10/117,768 filed Apr. 5, 2002, now U.S. Pat. No. 6,532,974, which claims benefit of provisional application Ser. No. 60/282,351, filed Apr. 6, 2001. All applications are hereby incorporated by reference in their entireties.

BACKGROUND OF THE INVENTION

The present invention relates to apparatus and processes for the manufacture of, more substrates specifically to those used for stripping and cleaning silicon wafers.

The importance of clean substrate surfaces in the fabrication of semiconductor microelectronic devices has been recognized for a considerable period of time. Over time, as VLSI and ULSI silicon circuit technology has developed, the cleaning processes have gradually become particularly critical step in the fabrication process. It has been estimated that over 50% of the yield losses sustained in the fabrication process are a direct result of workpiece contaminant Trace impurities, such as sodium ions, metals, and particles, are especially detrimental if present on semiconductor surfaces during high-temperature processing because they may spread and diffuse into the semiconductor workpiece and thereby alter the electrical characteristics of the devices formed in the workpiece. Similar requirements are placed on other such items in the electronics industry, such as in the manufacture of flat panel displays, hard disk media, CD glass, and other such workpieces.

Cleaning of a semiconductor workpiece, and other electronic workpieces, occurs at many intermediate stages of the fabrication process. Cleaning of the workpiece is often critical after, for example, photoresist stripping and/or ashing. This is particularly true where the stripping and/or ashing process immediately proceeds a thermal process. Complete removal of the ashed photoresist or the photoresist/stripper is necessary to insure the integrity of subsequent processes.

The actual stripping of photoresist from the workpiece is yet another fabrication process that is important to integrated circuit yield, and the yield of other workpiece types. It is during the stripping process that a substantial majority of the photoresist is removed or other wise disengaged from the surface of the semiconductor workpiece. If the stripping agent is not completely effective, photoresist may remain bonded to the surface. Such bonded photoresist may be extremely difficult to remove during a subsequent cleaning operation and thereby impact the ability to further process the workpiece.

Various techniques are used for stripping photoresist from a semiconductor workpiece. Mixtures of sulfuric acid and hydrogen peroxide at elevated temperatures are commonly used. However, such mixtures are unsuitable for stripping photoresist from wafers on which metals, such as aluminum or copper, have been deposited. This is due to the fact that such solutions will attack the metal as well as the photoresist. Solvent chemistries are often used after metal layers have been deposited. In either case, limited bath life, expensive chemistries, and high waste disposal costs have made alternative strip chemistries attractive.

Plasma stripping systems provide such an alternative and have been used for stripping both pre- and post metal photoresist layers. This stripping technique, however, does not provide an ideal solution due to the high molecular temperatures generated at the semiconductor workpiece surface. Additionally, since photoresist is not purely a hydrocarbon (i.e., it generally contains elements other than hydrogen and carbon), residual compounds may be left behind after the plasma strip. Such residual compounds must then the removed in a subsequent wet clean.

Ozone has been in various applications in the semiconductor industry for a number of years. Often the ozone is dissolved in deionized water to form an effective treatment solution. The attractive features of such a solution include low-cost, repeatable processing, minimal attack on underlying device layers, and the elimination of waste streams that must be treated before disposal. The main drawback with using such solutions has been the slow reaction rates that translate into long process times and flow throughput.

Photoresist strip using ozone dissolved in water has been somewhat more successful in achieving viable process rate at acceptable process temperatures. However, ozone, like all gases, has a limited solubility in aqueous solutions. At temperatures near ambient, ozone saturation occurs at around 20 ppm. Ozone solubility in water increases dramatically with decreasing temperature, to a maximum of a little over 100 ppm at temperatures approaching 0 degrees Celsius and drops to almost zero at temperatures approaching 60 degrees Celsius. While increasing ozone concentration increases the kinetic reaction rate, a decrease in temperature simultaneously suppresses that rate.

A technique for stripping photoresist and/or cleaning a semiconductor workpiece using ozone and deionized water is set forth in U.S. Pat. No. 5,464,480, titled "Process and Apparatus for the Treatment of Semiconductor Wafers in a Fluid", issued Nov. 7, 1995. The '480 patent purports to set forth a method and apparatus in which low temperature deionized water is ozonated by bubbling ozone through the low-temperature water. The low-temperature, ozonated, deionized water is in the form of a bath. Semiconductor wafers are batch processed by immersing the wafers in the bath, for example, to clean the wafers, strip photoresist, etc. However, this method of stripping wafers using ozone has slow process rates due to the low temperature of the deionized water.

Because of the desirability of using ozone in stripping applications, additional prior art methods of using ozonated wafer to strip wafers have been developed. One method includes placing the wafer in an ozone rich atmosphere, heating the surface of the wafer, and spraying cold deionized water on the heated wafer surface. However, as with previous methods of using ozone to strip photoresist from wafer surfaces, this method still has an undesirably slow process rate. This is because not enough ozone is reaching the surface of the wafer to react with and remove the photoresist. This occurs as a result of the deionized water not having sufficient levels of ozone dissolved therein.

Another method that has been developed to strip photoresist from wafers using ozone is to combine the above spraying method with the concept of mist generation. In performing this method, the wafers are placed in a process tank. Ozonated deionized water is then supplied to the process tank so that it fills a bottom portion of the tank. As such, the wafers are not immersed in the ozonated deionized water at all but suspended above the liquid surface. A heater is connected to the process tank so as to be capable of transferring heat to the ozonated deionized water. As the heater provides sufficient heat to the ozonated deionized water, a mist of ozonated deionized water is formed within the process tank. Because the mist consists of very tiny droplets of ozonated deionized water, and because the volume of the process tank above the liquid is filled with an ozone rich atmosphere, the tiny ozonated deionized water droplets absorb more ozone per volume before they contact the wafer surface. As such, when these droplets contact the wafer surfaces, they more efficiently strip the photoresist, resulting in faster processing rates. However, these stripping process rates are still less than optimal. Additionally, apparatus used to perform this method can be expensive due to the costs associated with buying and installing a proper heating element. Still another problem with this method and process tank is that the wafers are positioned in the tank and subjected to the stripping process while in a horizontal position. This impedes the removal of photoresist and increases process time.

Finally, many of these prior art tanks and methods of using ozonated wafer to strip photoresist cannot be used to perform additional wafer processing steps such as cleaning, rinsing, and drying. As such, additional process tanks must be purchased.

Thus, a need exists for a method and apparatus of stripping photoresist from semiconductor wafers using ozone that result in faster process rates and cheaper equipment. Additionally, a need exists for an apparatus that can perform photoresist stripping and other necessary processing steps, such as rinsing and/or drying, in the same process tank.

SUMMARY OF THE INVENTION

These problems and others are solved by the present invention which in one aspect is a method for stripping photoresist from integrated circuits comprising: placing at least one wafer having an edge in a process tank having a lid; closing the lid; filling the process tank with a process liquid to a predetermined level below the edge of the wafer; and applying acoustical energy to the process liquid so as to form a mist of process liquid in the process tank.

Preferably, the method further comprises applying acoustical energy to the wafer. It is preferable that the acoustical energy applied to the wafer be the same acoustical energy that is applied to the process liquid. In this embodiment, the acoustical energy applied to the process liquid will pass through the process liquid and across the wafer. This acoustical energy can be created by a megasonic transducer positioned at the bottom of the process tank.

In performing the method of the present invention, it is also preferable that the wafers be placed into the process tank and supported therein in a substantially upright position.

It is preferable for the stripping method to further comprise the steps of spraying the wafer with the process liquid and filling the remaining volume of the process tank with a process gas. It is preferable that the process tank be pressurized when the process gas fills the remaining volume of the process tank. Moreover, it is also preferable that the process liquid be a multi-fluid mixture comprising a liquid and a dissolved gas, the dissolved gas being the same as the process gas. Preferably, the process liquid is ozonated deionized water and the process gas is ozone.

The method of this invention can also comprise steps for rinsing and drying wafers following the stripping steps mentioned above. In the rinsing process, it is preferable that the method described above for stripping be immediately followed by the steps of: resuming the supply of the process liquid to the process tank so as to submerge the wafers, fill the entire process tank and overflow the process tank. After a predetermined time, it is preferable that this rinsing process further comprise: discontinuing the supply of process liquid; and discontinuing the application of acoustical energy to the process liquid and the wafers. Alternatively, this rinsing step can involve injecting chemicals into the process tank as the process tank is being entirely filled and overflowed with the process liquid. In order to dry the wafers, it is preferable that the rinsing step be followed by a drying method comprising: draining the process tank; and blowing hot drying gas on the wafers for a predetermined period of time.

In another aspect, the invention is a process tank having a processing chamber comprising: means to support at least one wafer in the processing chamber; means for filling the chamber with a process liquid; a lid adapted to close the chamber; a liquid level sensor adapted to stop the supply of process liquid to the chamber when the process liquid fills the chamber to a predetermined level below a wafer supported in the processing chamber; and an acoustical energy source adapted to supply acoustical energy to process liquid located in the chamber so as to create a mist of the process liquid in the processing chamber.

Preferably, the acoustical energy source is positioned in the chamber so that upon supplying acoustical energy to the process liquid, the acoustical energy passes through the process liquid and across the wafer's surface. In this embodiment, the source of acoustical energy can be a megasonic transducer located at the bottom of the processing chamber.

Also preferably, the process tank comprises means to spray the surface of the wafer with the process liquid when the wafer is supported in the processing chamber. It is additionally preferable that the wafer support means support the wafers in a substantially upright position.

It is further preferable for the process tank to comprise means to supply a process gas to the processing chamber, the process gas supply means being located above the predetermined level of the process liquid. In this embodiment, the process gas supply means can comprise a concentration sensor and a pressure regulator. It is preferable that the process gas be under pressure when in the chamber. As such, means to depressurize the chamber can be incorporated into the chamber. In this embodiment, the means to depressurize the chamber can be a properly controlled pressure regulator.

Preferably, the process tank comprises a re-circulation weir, wherein the re-circulation weir is adapted to re-circulate overflowed process liquid back into the processing chamber. Also preferably, the process tank comprises means to drain the processing chamber.

It is also preferable for the means for filling the chamber with process liquid to comprise a mixing device and a concentration sensor. Moreover, the process tank can be adapted to perform a variety of semiconductor processing steps including stripping, cleaning, drying, chemical etching, and rinsing. Finally, the process tank can comprise a temperature sensor.

DETAILED DESCRIPTION OF THE DRAWINGS

FIG. 4 is a flow diagram of an embodiment of the method of the present invention, stripping photoresist from wafers at an increased process rate and decreased equipment costs. The method of FIG. 2 will be described in detail below with respect to the megazone process tank illustrated in FIG. 1.

Figure 1:
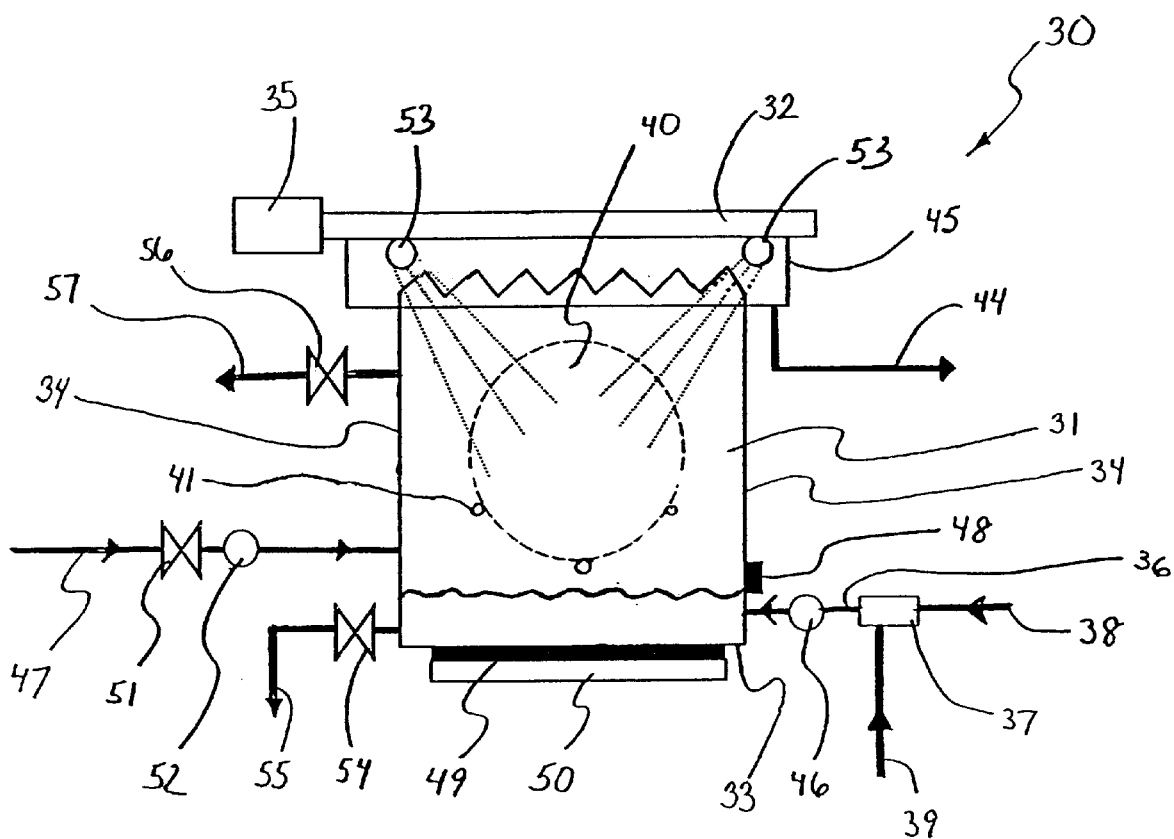
FIG. 1 is a schematic cross sectional view of an embodiment of the process tank of the present invention, a megasonic process tank.

FIG. 1 illustrates an embodiment of the present invention, megazone process tank 30. Megazone process tank 30 comprises processing chamber 31 and lid 32. Tank walls 34 form processing chamber 31. Tank walls 34 are constructed of PVDF with rounded corners and are a minimum thickness of three-eighths of an inch.

Figure 3:
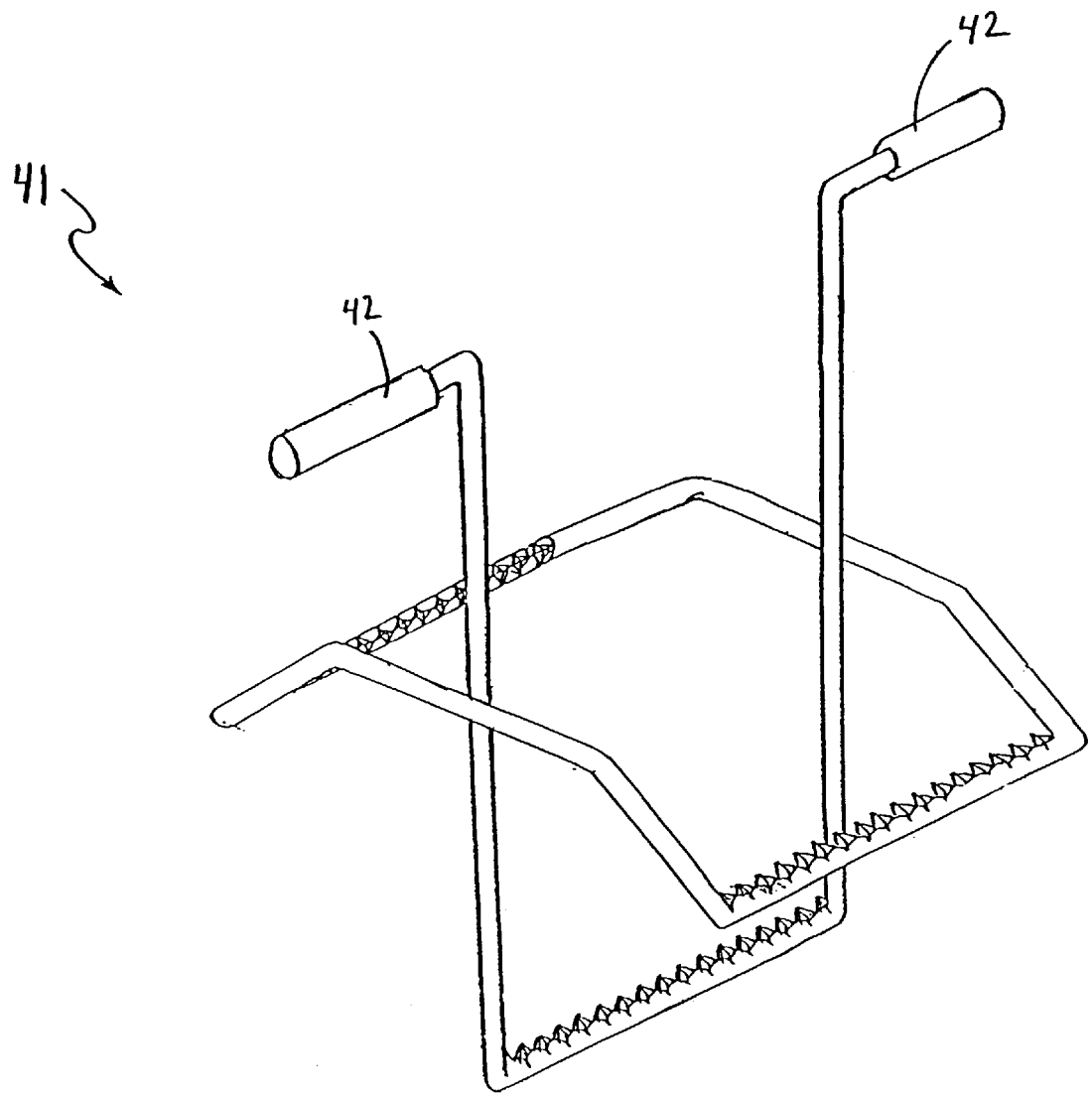
FIG. 3 is a specially designed wafer carrier capable of properly supporting wafers in the megazone process tank in accordance with the present invention

Processing chamber 31 is adapted to receive and support a plurality of wafers 40 in an upright position above the bottom 33 of processing chamber 31. Wafers 40 can be supported in processing chamber 31 by a variety of methods. For example, a structure can be built into or positioned in processing chamber 31 that engages and supports wafers 40 with minimal contact. Alternatively, walls 34 of processing chamber 31 can modified so as to engage and suspend a wafer carrier as it is lowered into processing chamber. However, it should be noted that the exact means by which walls 34 will support a wafer carrier will vary greatly depending on the dimensions of the wafer carrier being used and the fluid flow requirements of the processes to be performed in the process tank. In the illustrated embodiment, support of wafers 40 is achieved by adapting processing chamber 31 to receive and support specially designed wafer carrier 41 (FIG. 3). Wafer carrier 41 is designed to carry a plurality of wafers 40 with minimal contact and minimal fluid flow obstruction.

Figure 2:
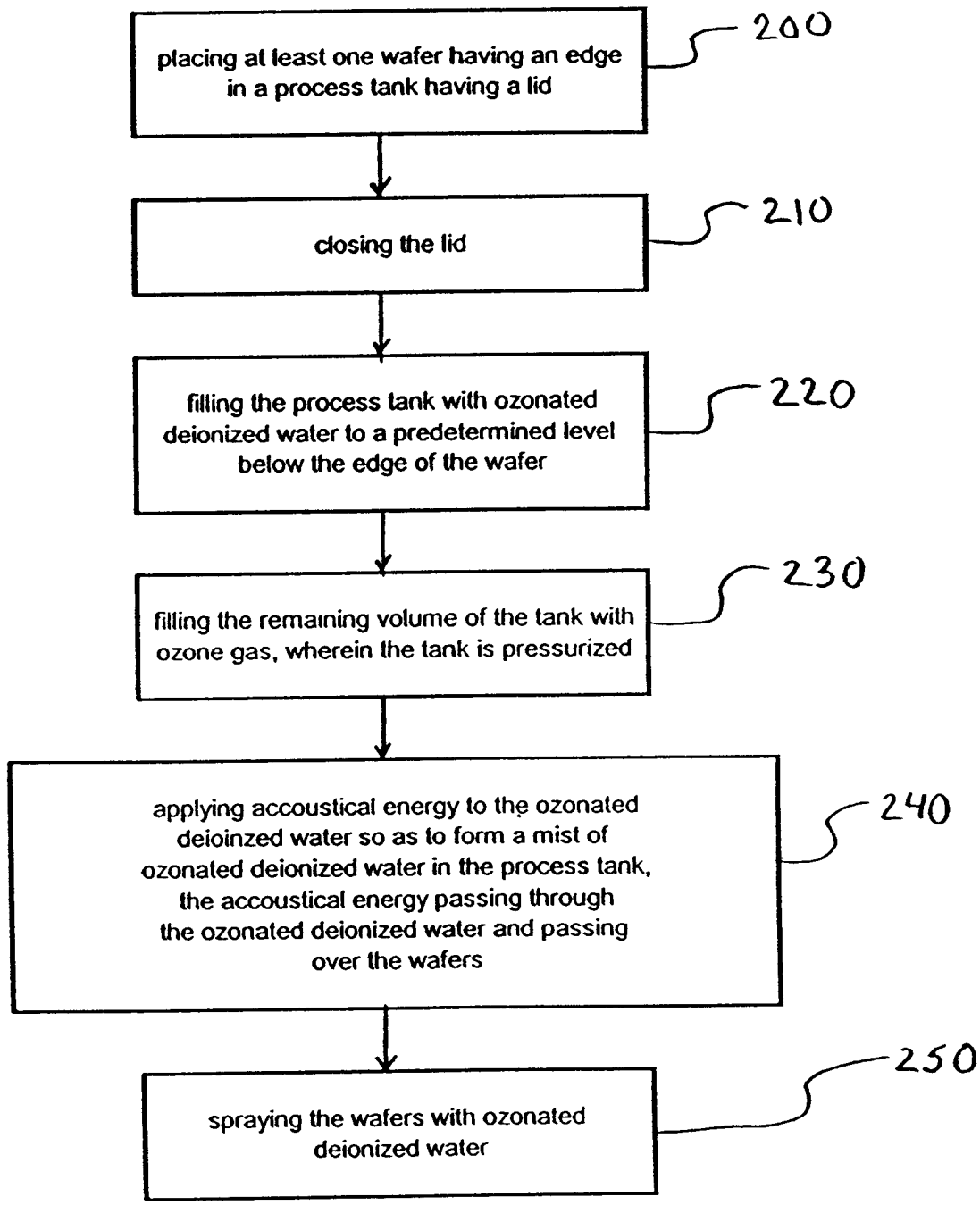
FIG. 2 is a flow diagram of an embodiment of the method of the present invention, a method for stripping photoresist from wafers at an increased process rate and decreased equipment cost.

Referring to FIG. 3, wafer carrier 41 can be supported in processing chamber 31 by lowering the wafer carrier into processing chamber 31 until handles 42 contact and engage the top of walls 34. As such, the wafers 40 are sufficiently lowered into processing chamber 31, supported uprightly, and positioned above bottom 33. As a result, step 200 of FIG. 2 is completed. It should be noted that wafer carrier 41 is the subject of a pending U.S. Patent Application (application number not yet assigned).

Referring back to FIG. 1, once the wafers are placed in processing chamber 31, lid 32 is closed, completing step 410 of FIG. 4. Tank lid 32 is designed so that when it is closed, ozone within processing chamber 31 can not escape. However, a tight seal is not required. Lid 32 is attached to lid controller 35 which is electrically connected to a PC having a properly programmed processor. As such, opening and closing of lid 32 can be automated, the closing and opening times are controlled by variables inputted by an operator.

Megazone tank 30 further comprises process liquid supply line 36. Process liquid supply line 36 is fluidly connected to processing chamber 31 on one end and mixing device 37 on the other. As such, a fluid connection is formed, enabling the desired process liquid to be transported to processing chamber 31 from mixer 37 as needed. The direction through the fluid lines of megazone process tank 30 are flow is indicated by the arrows.

Mixer 37 is also fluidly connected to deionized water supply line 38 and chemical supply line 39. Deionized water supply line 38 transports deionized water from a DIW reservoir to mixing device 37. It is possible for the deionized water to be ozonated before entering mixing device 37 in a variety of ways. First, the DIW reservoir itself can contain ozonated deionized water. This can occur if re-circulation line 44 fluidly connects DIW reservoir and re-circulation weir 45. This will be described in detail below. A second way by which the deionized water can be ozonated before entering mixing device 37 is by fluidly connecting an ozone gas supply line to deionized water supply line 38 before mixer 37 and dissolving the ozone gas in the deionized water stream.

Chemical supply line 39 is also fluidly connected to mixing device 37 and can be used to transport a variety of wafer processing chemicals to mixing device 37. Examples of such chemicals are ammonium hydroxide, hydrochloric acid, hydrochloric acid, hydrogen peroxide, standard clean 1, and standard clean 2. As such, megazone process tank 30 can be used to perform virtually any wafer processing step.

If it is desired by the operator, chemical supply line 39 and deionized water supply line 38 can supply their respective fluids simultaneously. This will be dictated by the manufacturing process step to be performed. The operator controls the flows by variables inputting into a PC interface having a properly programmed processor electrically connected to mass flow control systems located on the chemical supply line 39 and the deionized water supply line 38. These types of controls and methods of coupling these systems are very well known in the art.

Mixing device 37 can mix the chemical supplied by chemical supply line 39 and the ozonated deionized water supplied by line 38 to output a multi-fluid mixture into process liquid supply line 36. Liquid supply line 36 is equipped with concentration sensor 46. Concentration sensor 46 can measure the concentration levels of the fluids that make up the multi-fluid mixture passing through process liquid supply line 46 if a multi-fluid mixture is being used. As used herein, the term "fluid" encompasses both a gas and a liquid. Concentration sensor 46 determines the concentration levels of a component fluids of the multi-fluid mixture by measuring the conductivity of the multi-fluid mixture as it passes through. Such concentration sensors are well known in the art. Concentration sensor 46 can be used to monitor and control the ratio of deionized water to chemical if a step is being performed in which a chemical is being injected into the deionized water stream.

Returns now to the discussion regarding stripping photoresist from wafers 40 according to the method of the present invention, once the wafers 40 are positioned in processing chamber 31 and lid 32 is closed as described above, deionized water is supplied to processing chamber 31 via process liquid input line 36. As deionized water is supplied to processing chamber 31, the deionized water fills the bottom of chamber 31 until liquid level sensor 48 detects that the deionized water has reached a predetermined level. Liquid level sensor 48 can be a float sensor. The predetermined level should be set so that megasonic transducer 49 is covered with a sufficient volume of deionized water that ensures that megasonic transducer 49 can be operated without being permanently as a result of damage an acoustic mismatch with the gas phase above the liquid. Exact volume requirements are dictated by the amplitude and frequency of the acoustical energy to be supplied by megasonic transducer 49 and can be easily determined by those in the art for any specific application. Additionally, the predetermined level must be low enough so that the wafers 40 are not immersed at all in the deionized water liquid. This can be done by ensuring wafers 40 are at a high enough position in chamber 31. Once deionized water has filled processing chamber 31 to the predetermined level, liquid level sensor 48 sends a signal to a properly programmed processor to stop the deionized water supply through line 36. This processor discontinues the deionized water (DIW) flow into the tank by communicating with a mass flow controller (not shown) located on line 38. As such, step 220 of FIG. 2 is completed.

Once the DIW has reached the predetermined level, megasonic transducer array 49 is activated. The use of megasonic transducers in semiconductor wafer processing is very well known in the art. Megasonic transducer 49 emits acoustical energy into the DIW located at the bottom of the tank. By having megasonic transducer 49 positioned on the bottom 33 of processing chamber 31, the emitted acoustical energy passes through the DIW and comes into contact with the wafers 40. As this occurs, megasonic transducer 49 transmits sufficient energy to the DIW to cause small droplets of DIW to break away from the liquid surface and form a mist in processing chamber 31. Additionally, the acoustical energy passing through the DIW and contacting the wafers 40, the transmits additional kinetic energy to the wafers 40. This energy helps to break bonds that hold the photoresist to the wafer and as such facilitates stripping of photoresist on the wafers 40. As such step 240 of FIG. 2 is completed. Megasonic transducer 49 is activated for a predetermined period of time which is controlled by megasonic controller 50. Megasonic controller 50 can be a properly programmed processor.

By using megasonic transducer 49 to create the DIW mist instead of a heater as is used in the prior art, two advantages are achieved. First, the megasonic transudcer 49 applies acoustical energy to the wafers 40 which increases stripping rates. Second, because most process tanks already have transducers installed for use in other process steps, no additional equipment is needed. Thus, the extra expenses associated with the heater equipment are eliminated.

Concurrently with applying the acoustical energy the volume of chamber 31 not occupied by the DIW liquid is filled with ozone gas through process gas inlet line 47. Process gas inlet line 47 comprises pressure regulator 51 and gas concentration sensor 52. Pressure regulator 51 and gas concentration sensor 52 are coupled to a properly programmed processor which allows the operator to control flow rates of the ozone into processing chamber 31. The ozone is supplied to processing chamber so as to be under increased pressure. Increased pressure of the ozone helps increase the diffusion amounts and rates of the ozone gas into the DIW mist. As such, when this DIW with increased ozone concentration contacts the wafers 40, photoresist at an increased level. As such, step 230 of FIG. 2 is completed. Moreover, process gas line 47 can be used to transport any gas needed to process semiconductor wafers, such as carbon dioxide, ozone, nitrogen, chlorine, ammonia, or fluorine. As such, megazone tank 30 can be used to complete almost any wafer processing step Also concurrently with applying the acoustical energy, sprayers 53 are activated. Sprayers 53 are fluidly connected to the DIW reservoir that feeds line 38. Upon being activated, sprayers 53 spray DIW on the wafers 40, completing step 250 of FIG. 2. This spray further increases the striping process rate. By having the wafers 40 in a substantially upright position, the DIW flows down the wafer surface. As such, kinetic energy of the flowing DIW helps remove the photoresist at an even faster rate. Additionally, having processing chamber 31 filled with pressurized ozone as described above, increases the concentration levels of ozone in all the DIW that contacts the wafers 40, including the DIW from sprayers 53.

Once the wafers 40 have been properly stripped of photoresist, drain valve 54 can be opened, allowing the DIW and the photoresist particles at the bottom of chamber 31 to exit the processing area through drain line 55. At this point, pressure relief valve 56 can be opened, allowing the pressurized ozone to escape through pressure relief line 57, returning the pressure in processing chamber 31 back to normal.

Preferably, drain valve 54 is not opened at this time. Instead DIW line 38 is activated after stripping is completed. As such, DIW is once again supplied to processing chamber 31 perform a rinse step.

Upon completion of stripping, megazone tank 30 can be used to rinse, clean, and dry the wafers 40. In rinsing the wafers 40, DIW is continuously supplied by line 38 through line 36 into processing chamber 31. Ozone is also continuously supplied through line 47, ozonating the DIW water as it fills chamber 31. Eventually, the wafers 40 are fully submerged in the ozonated DIW and the ozonated DIW fills processing chamber 31 until it is overflowing into re-circulation weir 45. This occurs for a predetermined period of time until the rinsing is completed. It is preferable that megasonic transducer 49 be activated the entire time to facilitated rinsing and cleaning of wafers 40. Re-circulation weir 45 captures the overflowing ozonated DIW and funnels it into re-circulation line 44. Re-circulation line 44 transports the ozonated DIW back into the DIW reservoir. As such, when the DIW reservoir is used again to supply sprayers 35 or line 38, the DIW will be ozonated. This will further increase the ozone concentration levels and will further increase striping rates as the megasonic system is used.

Moreover, as the ozonated DIW is supplied to the processing chamber 31 for the rinsing step as described above, chemical line 39 can inject desired amounts of cleaning chemicals into the DIW flow. The exact amounts and identity of the chemicals will be dictated by the process requirements and the wafers 40 being processed.

Once rinsing/cleaning is completed, processing chamber 31 can be used to dry the wafers. A chamber 31 is first drained at a controlled rate by opening drain valve 54. Hot Nitrogen gas can then pumped into processing chamber 31 via process gas inlet line 47. This will facilitate drying of wafers 40.

Finally, it is possible to have a temperature sensor attached somewhere in processing chamber 31. By coupling the temperature sensor to a processor, optimal temperature can be maintained to maximize stripping process rates and/or ozone solubility in the DIW. This is done by coupling the processor to a heating or cooling element properly located within the megazone system.

The foregoing discussion discloses and describes merely exemplary embodiments of the present invention. As will be understood by those skilled in this art, the invention may be embodied in other specific forms without departing from the spirit or essential characteristics thereof. Accordingly, the disclosure of the present invention is intended to be illustrative, but not limiting, of the scope of the invention, which is set forth in the following claims. Specifically, the methods and apparatus claimed herein are out limited to the production of integrated circuits but can be used with respect to any flat substrate.

What is claimed is:

1. A method for processing wafer substrates comprising:
   placing at least one wafer substrate having an edge in a process tank having a lid;

closing the lid;

filling the process tank with a process liquid to a predetermined level below the edge of the wafer substrate;

supplying a process gas under pressure to a remaining volume of the process tank; and applying acoustical energy to the process liquid so as to form a mist of process liquid in the process tank.

2. The method of claim 1 further comprising applying acoustical energy to the wafer substrate.

3. The method of claim 2 wherein the acoustical energy applied to the wafer substrate is the same acoustical energy that is applied to the process liquid.

4. The method of claim 3 wherein the acoustical energy applied to the process liquid passes through the process liquid and across the wafer substrate.

5. The method of claim 4 wherein the acoustical energy is created by a megasonic transducer positioned at the bottom of the process tank.

6. The method of claim 2 further comprising:

supplying the process liquid to the process tank so as to submerge the wafers substrate, fill the entire process tank, and overflow the process tank after the method of claim 2 is performed for a predetermined period of time.

7. The method of claim 6 further comprising:

discontinuing the supply of process liquid after a predetermined period of time; and discontinuing the application of acoustical energy to the process liquid and the wafers substrate.

8. The method of claim 7 further comprising:

draining the process tank; and blowing hot drying gas on the wafers substrate for a predetermined period of time.

9. The method of claim 6 further comprising injecting chemicals into the process tank as the process tank is being entirely filled and overflowed with the process liquid.

10. The method of claim 1 wherein the wafers substrate is placed into the process tank in a substantially upright position.

11. The method of claim 1 further comprising spraying the wafer substrate with the process liquid.

12. The method of claim 1 wherein the process liquid is a multi-fluid mixture comprising a liquid and a dissolved gas, the dissolved gas being the same as the process gas.

13. The method of claim 12 wherein the process liquid is ozonated deionized water and the process gas is ozone.

14. A method for processing wafer substrates comprising:

placing at least one wafer substrate having an edge in a process tank having a lid, the wafer substrate being in a substantially upright position;

filling the process tank with ozonated deionized water to a predetermined level below the edge of the wafer substrate;

closing the lid;

filling the remaining volume of die process tank with ozone, the ozone being under pressure;

applying megasonic energy to the ozonated deionized water so as to form a mist of the ozonated deionized water in the process tank, the megasonic energy passing through the ozonated deionized water and across the wafer substrate; and spraying the ozonated deionized water over the wafer substrate.

* * * * *